United States Patent [19]

Dilts et al.

[11] Patent Number: 4,567,642
[45] Date of Patent: Feb. 4, 1986

[54] METHOD OF MAKING PHOTOVOLTAIC MODULES

[75] Inventors: David A. Dilts, Gates Mills; Robert A. Hartman, Chagrin Falls, both of Ohio

[73] Assignee: The Standard Oil Company, Cleveland, Ohio

[21] Appl. No.: 655,902

[22] Filed: Sep. 28, 1984

[51] Int. Cl.$^4$ .............................................. H01L 31/18
[52] U.S. Cl. .................................. 29/572; 29/577 R; 29/589; 136/244, 245
[58] Field of Search ............... 29/572, 577 R, 589; 136/244, 245

[56] References Cited

U.S. PATENT DOCUMENTS

| 3,565,719 | 2/1971 | Webb | 156/212 |
| 3,849,880 | 11/1974 | Haynos | 29/626 |
| 4,154,998 | 5/1979 | Luft et al. | 219/10.49 R |
| 4,173,820 | 11/1979 | Mueller et al. | 29/572 |
| 4,219,926 | 9/1980 | Bloch et al. | 29/832 |
| 4,306,108 | 12/1981 | Henesian | 136/245 |
| 4,348,546 | 9/1982 | Little | 136/256 |
| 4,430,519 | 2/1984 | Young | 136/244 |
| 4,451,970 | 6/1984 | Izu et al. | 29/574 |

Primary Examiner—Aaron Weisstuch
Attorney, Agent, or Firm—Thomas P. Schur; Joseph G. Curatolo; Larry W. Evans

[57] ABSTRACT

An apparatus for making a photovoltaic module having a plurality of cell strips. The apparatus (10) includes a frame (11) and a support drum (25) rotatably received in the frame (11). The support drum (25) has a substantially curved surface (42) having a plurality of paired dowel guides (45) for registering cell strips (50) relative to the surface (42) and an interconnect mesh (36) relative to the cell strip (50). A plurality of paired complimentary clamp sets (51, 52) receive and secure the cell strips (50) and the interconnect mesh (36) to the support drum (25).

8 Claims, 5 Drawing Figures

METHOD OF MAKING PHOTOVOLTAIC MODULES

TECHNICAL FIELD

The present invention relates generally to a device for fabricating photovoltaic modules. More particularly, the present invention relates to a device for making a photovoltaic module having a plurality of photovoltaic cell strips electrically interconnected by means of electrically conductive filaments. Specifically, the present invention pertains to an apparatus for positioning and interconnecting electrically conductive filaments to the corresponding photovoltaic cell strips. To elaborate on this aspect, the present invention permits a plurality of photovoltaic cell strips to be positioned relative to each other and provide an obstruction-free work area for selectively positioning and connecting a continuous electrically conductive filament alternately and repetitively to the cell strips.

BACKGROUND ART

Because of the increasing costs of exploration, processing and use of conventional fuels, such as coal, oil and gas, developments have been made to utilize alternative energy sources. One of these alternative energy sources which has been the subject of considerable interest is solar energy. Particularly, vast developments have been made in harnessing and converting solar energy into usable electrical energy.

As a result of the developments made in harnessing solar energy, three primary types of photovoltaic devices have come into being: crystalline solar cells, semicrystalline solar cells, and amorphous solar cells. Each of these solar cell types produces electricity as a result of what is commonly known in the solar cell field as the photovoltaic effect. This is an inherent feature of a semiconductor region in the photovoltaic device which, in the case of amorphous silicon cells, generally comprises adjacent, layered regions of P-type doped amorphous silicon and N-type doped amorphous silicon which define a PN junction, or P-type doped amorphous silicon, intrinsic (I type) amorphous silicon, and N-type doped amorphous silicon which define a PIN junction. Upon exposure to solar radiation, an electric field is generated across this junction as electrons and holes move thereacross, thereby generating electrical current. For a more detailed discussion regarding the physical structure and electrical characteristics of amorphous solar cells, reference may be made to U.S. Pat. No. 4,409,605 to Ovshinsky et al.

An inherent problem with any type of solar cell involves the collection of electrical energy from the solar cell itself. Particularly, the electrical connection to the surface exposed to solar radiation is of major concern. This is so because any electrical collector means must ideally exhibit good electrical conductivity with high solar radiation transparency. Unfortunately, these two parameters are not found in any one material which is economical to solar cell production. As such it has been necessary to employ at least two distinct electrical conductor means to collect the electrical energy from the solar cell.

One arrangement normally employed in amorphous solar cell design involves a transparent conductive oxide (TCO) layer, such as indium tin oxide or indium oxide, layered over the top layer—either P or N type—of the semiconductor region of the solar cell. The TCO layer permits the influx of solar radiation into the semiconductor region while providing an electrical path therefrom. However, the electrical resistivity of the TCO layer is relatively substantially great and, therefore, restricts electrical current flow over large surface distances. To remedy this problem, it is necessary to provide electrical conductors of lower electrical resistance adjacent to, and electrically communicating with, the TCO layer to receive the electrical current therefrom. Suitable electrical conductors of this type are generally silver ink grids screen-printed onto the TCO surface. However, these grids are limited in size because of their current carrying capacity and the shadowing effect they have on the solar cell, inasmuch as these grids are generally opaque. As such, the overall efficiency of a solar cell declines as the surface area of the grid increases.

One solution to this size limitation problem is to employ several relatively small solar cells electrically joined together in series and in parallel through a network of interconnections to form solar modules and/or arrays. These are capable of providing a variety of voltage and current outputs as a result of the particular electrical interconnections. Another advantage of these solar assemblies is that should any of the individual solar cells fail to produce electrical energy, the entire electrical output of the assembly will only be slightly diminished and generally will remain functional.

The use of multi-celled solar modules, however, is not without inherent problems. Particularly, the interconnections between solar cells are generally relatively small and, as such, are highly susceptible to mechanical and thermal stresses experienced by the solar module. Indeed, the normal handling of the solar module during fabrication, installation and maintenance may easily damage the electrical connection network. Moreover, the cyclic temperature change which the solar module experiences, as it is exposed to periods of sunlight and periods of darkness, causes thermally induced stresses in the electrical interconnections which ultimately result in fatigue failures thereof.

Efforts to remedy these stress problems have resulted in the general acceptance of electrical interconnections of substantial size which are more resistant to the stress loadings. However, the larger size of the interconnections causes increased shadowing of the solar cells in those areas where they overlay, thereby detrimentally reducing the output of electrical energy from the solar cell. To avoid such optical obscuration losses caused by the shadowing effect on the solar cell, the electrical interconnections in amorphous silicon solar cells, at least, have been joined to the peripheral edge of the TCO layer. However, this, too, causes detrimental reduction in the electrical output of the solar cell as current received by the TCO layer at the distal extreme end from the interconnection junction is required to travel the full width of the solar cell through the poorly conductive TCO layer.

Another problem experienced in these electrical interconnections is the lack of flexibility thereof. Particularly with the development of amorphous solar cells on thin metal substrates, which are substantially more flexible than the crystalline solar cells, the rigidity of the electrical interconnection has been a limiting factor in developing new applications for solar arrays. The desirable characteristic of the solar array of assuming the shape of currently existing support surfaces, an attribute of amorphous solar cells, is substantially precluded because of the inflexible electrical interconnections.

Exemplary of the existing technology pertaining to this aspect of the art are U.S. Pat. No. 4,410,558 to Izu et al, and U.S. Pat. No. 4,419,530 to Nath. Particularly, Izu et al discloses a system for producing amorphous solar cells in continuous strip form on thin metal substrates. Such a system provides economical solar cell material which may then be employed in solar cell modules and arrays. Nath discloses a method for interconnecting a plurality of solar cells to form a large area solar cell panel. The interconnect system disclosed permits individual solar cells to be selectively electrically isolated from the solar cell panel, as when, for example, an individual solar cell is determined to be defective. While these disclosures constitute advantageous contributions to the art of solar cells, they do not resolve the above-discussed problems.

In addition to the foregoing problems, the process of locating and securing the electrical interconnections relative to each individual solar cell in the array requires substantial man-hours during assembly. This time consuming process results in labor costs which account for a major portion of the overall cost of the solar array. Indeed, the exceedingly high cost of solar arrays has been a considerable hindrance in the development and commercialization of photovoltaic devices.

Despite the substantial work and research directed to development of photovoltaic devices, no device has, yet, been developed for making photovoltaic modules embodying the desirable attributes currently sought. Namely, no device permits a plurality of individual photovoltaic cell strips to be electrically interconnected by highly conductive filaments which are resistant to mechanical and thermal stresses. Moreover, no device obviates the tedious and costly procedure of precisely locating and securing such conductive filaments relative to the photovoltaic cell strips.

DISCLOSURE OF THE INVENTION

In general, an apparatus for making a photovoltaic module having a plurality of cell strips, according to the concept of the present invention, includes a frame and a drum carried by the frame. The drum has a curved surface suitable for receiving a plurality of cell strips. Means are provided to locate the cell strips when the latter are received by the cured surface of the drum. Means are also provided to secure the cell strips to the curved surface when so received. Furthermore, the apparatus includes means for positioning electrically conductive interconnects relative to the cell strips for securement thereto.

A preferred embodiment of an apparatus for making a photovoltaic module incorporating the concept of the present invention is shown by way of example in the accompanying drawings and specification without attempting to show all the various forms and modifications in which the invention might be embodied, the invention being measured by the appended claims and not by the details of the specification.

PREFERRED EMBODIMENT FOR CARRYING OUT THE INVENTION

Figure 1:
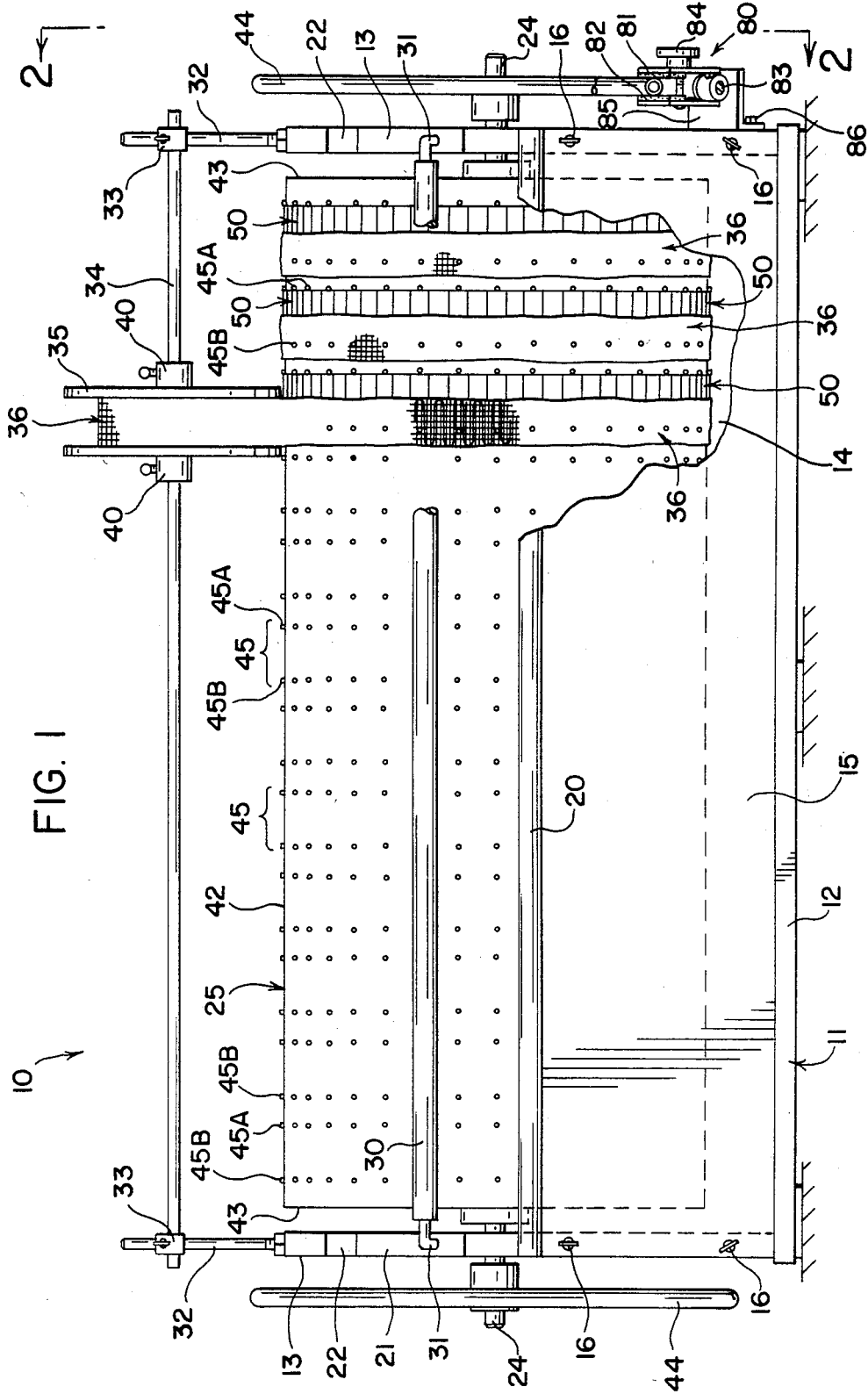
FIG. 1 is a front elevational view of an apparatus for making photovoltaic modules embodying the concept of the present invention.

An apparatus for making a photovoltaic module, hereinafter referred to as an interconnect drum assembly, for convenience, according to the present invention is indicated generally by the numeral 10 in FIG. 1 of the accompanying drawings. The interconnect drum assembly 10 depicted therein, and described herebelow, is particularly suitable for making a photovoltaic module as set forth in a U.S. patent application filed contemporaneously herewith, viz. U.S. patent application Ser. No. 656,175, filed Sept. 28, 1984, for "Photovoltaic Cell Module".

Interconnect drum assembly 10 includes a frame 11 having a base plate 12, a pair of upstanding side plates 13 carried by the lateral ends of base plate 12, and a back plate 14 secured to base plate 12 and side plate 13. Inasmuch as these members represent substantially the load bearing structure of interconnect drum assembly 10, it is preferred that base plate 12, side plates 13 and back plate 14 be constructed of substantially rigid material such as steel plate, and that such members be fixedly secured together such as by welding.

A removable cover 15 is secured to the front of drum assembly 10 by retaining clips 16 removably affixed to side plates 13. The uppermost end of cover 15 defines a rolled lip 20 which offers a smoothly contoured surface in the vicinity of the work area, as will become apparent herebelow.

Inasmuch as side plates 13 are essentially mirror images of each other, it is necessary only to describe one side plate 13 in detail, the description of which applying equally to the other side plate 13. Therefore, with reference to FIG. 2, the right side plate 13 will be considered. Particularly, side plate 13 is essentially a rectangular plate having its upper front corner removed, thereby defining a rearwardly extending face 21. Although not necessarily critical to the function of drum assembly 10, face 21 is oriented rearward approximately 40° from the front of side plate 13.

Receiving slot 22 extends orthogonal to face 21 and terminates slightly above and forward of the mid-point of side plate 13. The innermost extent of receiving slot 22 carries a bearing 23. As will become apparent herebelow, receiving slot 22 and bearing 23 are suitably sized and configured to receive and locate the shaft 24 of a support drum 25. Accordingly, the width of receiving slot 22 is sufficiently greater than the diameter of shaft 24, so as to permit ease of ingress and egress, and bearing 23 is properly sized to permit uniform rotative support for drum 25. The mouth of receiving slot 22 may be somewhat chamfered as at 26 to facilitate reception of shaft 24.

Rearwardly extending face 21 also provides support for a removable arm rest 30. Such support is in the form of a plurality of holes in face 21 to slidably receive the support legs 31 of arm rest 30. It may also be desirable to provide a plurality of holes in face 21 to permit arm rest 30 to be selectively located thereabout.

Figure 2:
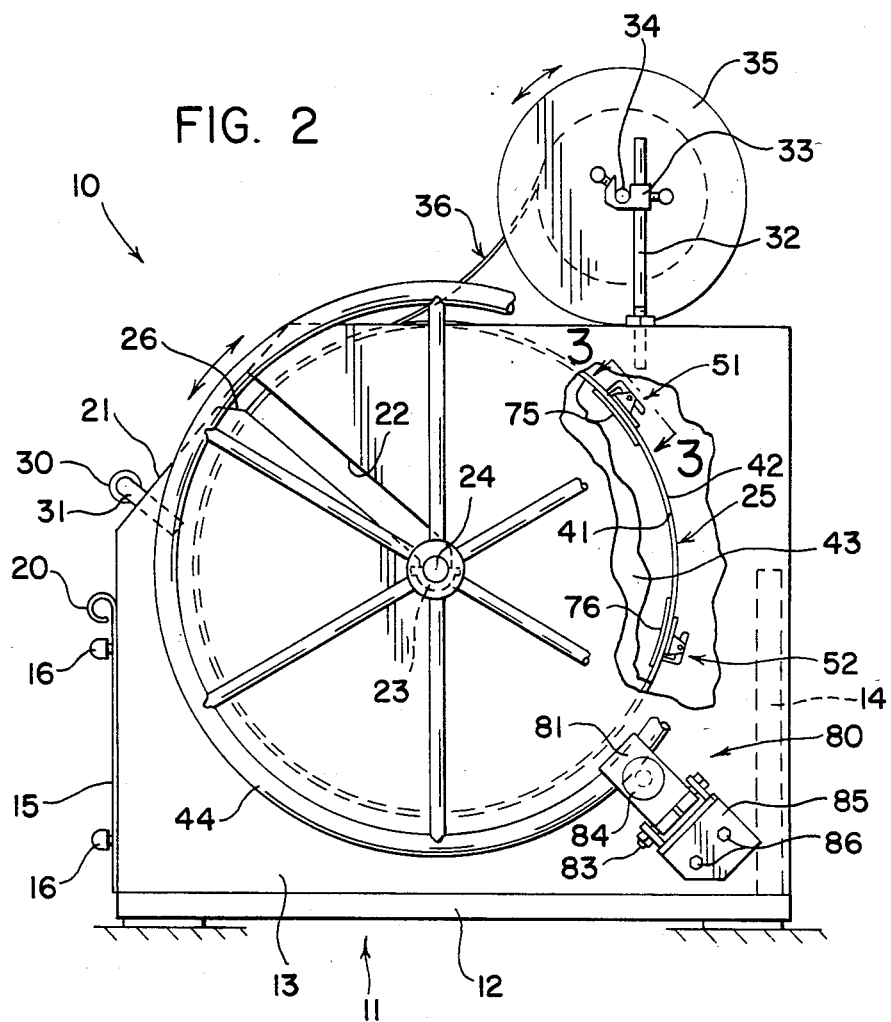
FIG. 2 is a side elevational view taken substantially along line 2—2 of FIG. 1.

The top of each side plate 13 permits securement of upright support bars 32, each carrying an adjustable clamp 33. Such arrangement defines the mounting for a removable lateral spool bar 34 for carrying a rotatable spool 35 of interconnect mesh 36, as will be discussed herebelow. A pair of slidable collars 40 selectively, laterally locate and retain spool 35 along spool bar 34 relative to support drum 25. As depicted in FIG. 2, it is preferred that spool 35 be located above support drum 25 and slightly rearward of the centerline of the latter so as to permit interconnect mesh 36 to be easily unfurled onto support drum 25 as will be discussed herebelow.

With the structure of frame 11 thus described, attention is directed to support drum 25, itself. Indeed, support drum 25 is a curved, preferably cylindrical member having a cylindrical wall 41 defining a support surface 42 extending between a pair of axially displaced radial end walls 43. Shaft 24 extends axially through support drum 25 and is fixedly secured to end walls 43, such that drum 25 and shaft 24 will rotate together. It should be noted that because drum 25 rotates about its axis, to minimize momentum and inertia forces acting thereon, it is preferred that drum 25, and particularly cylindrical wall 41 and end walls 43, be constructed of light-weight material having good structural rigidity. Moreover, for reasons that will become apparent herebelow, it is preferred that the material of which support drum 25 is constructed has good high-temperature properties including acceptable thermal expansion coefficients. Such materials may be aluminum or a light-weight polymer. To further reduce the weight of drum 25, cylindrical wall 24 is preferably of relatively thin cross-section.

Shaft 24 extends a substantial distance axially beyond each end wall 43, as depicted in FIG. 1. This permits shaft 24 to be received in slots 22 and rotatably carried by bearings 23 in side plates 13; and, further to enable a pair of hand wheels 44 to be mounted thereon, one on each end axially, for rotative manipulation thereof. It should thus be appreciated that such an arrangement permits support drum 25 to be selectively rotated when mounted in frame 11, as will be discussed herebelow. While this exemplary embodiment discloses the use of hand wheels 44 to selectively rotate support drum 25, other assemblies are likewise contemplated. Indeed, hand wheels 44 could be replaced with a motor and drive train to provide automated or semi-automated rotation of support drum 25, as would be recognized to one skilled in the art of machine design.

Located about support surface 42, at axially displaced loci, are paired sets of dowel guides 45, defining strip guides 45A and mesh guides 45B. These guides 45 define the axial position for respective cell strips 50 and corresponding interconnect mesh 36 when carried by support drum 25. The circumferential distance through which dowel guides 45 extend about support surface 42 will vary according to the length of the cell strip 50 being interconnected. But, it is generally preferred that the circumferential extent of dowel guides 45 represent approximately 80 to 85 percent of the overall circumference of support drum 25. For example, a support drum 25 suitable for receiving cell strips having a length of approximately 120 centimeters should have a circumference of approximately 150 centimeters.

Associated with each paired set of dowel guides 45, and located at the circumferential ends thereof, are matched sets of clamps, 51 and 52 respectively, as depicted in FIG. 2, which serve the function of selectively securing cell strips 50 and interconnect mesh 36 to support surface 42. These clamps cooperate with each other for such securement and accordingly are mirror images of each other. As such, detailed discussion of one clamp set 51 will be given here with the understanding that such discussion is equally applicable to all the other clamp sets on support drum 25, including the cooperative clamp sets 52.

Figure 3:
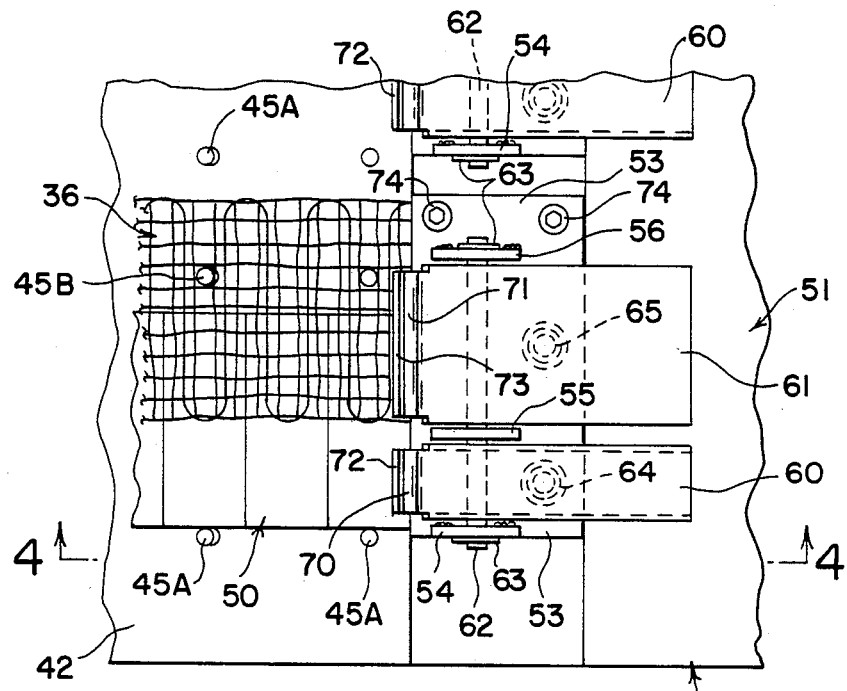
FIG. 3 is an enlarged fragmentary plan view taken substantially along line 3—3 of FIG. 2.
Figure 4:
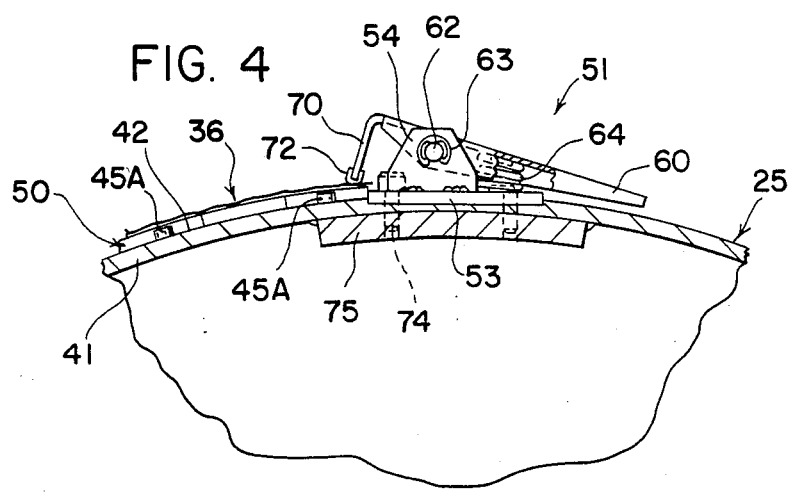
FIG. 4 is an enlarged fragmentary elevational view taken substantially along line 4—4 of FIG. 3.

With particular reference to FIG. 3 and FIG. 4, clamp set 51 includes a clamp pad 53 having three upstanding flanges 54, 55, and 56, respectively. Pivotally positioned between flanges 54 and 55 is a cell clamp 60, while mesh clamp 61 is pivotally positioned between flanges 55 and 56. Cell clamp 60 is approximately one-half the width of mesh clamp 61 while the other features thereof are essentially identical, as will be appreciated herebelow. A common pin 62 pivotally joins both cell clamp 60 and mesh clamp 61 to clamp base 53 and is retained in place by clips 63 at each axial end thereof. Cell clamp 60 and mesh clamp 61 each have a corresponding compression spring 64 and 65, respectively, which imparts the retentive clamping force to the cell strip 50 and interconnect mesh 36 through the respective clamp finger 70 and 71. So as not to damage the cell strip 50 or interconnect mesh 36, it is desirable to employ a protective cap, 72 and 73, on the end of each clamp finger, 70 and 71 respectively. These caps are preferably made from an elastomer material capable of withstanding elevated temperatures; for this purpose a fluoroelastomer having a durometer hardness of 80 to 90 is suitable. It should be appreciated that the retentive clamping force exerted by cell clamp 60 and mesh clamp 61 need be sufficient enough to retain cell strip 50 and/or interconnect mesh 36 without causing physical deformation thereof.

Clamp sets 51 and 52 are secured to support drum 25 by a plurality of cap screws 74 passing through clamp pad 53. This allows for removal of the clamp sets 51 and 52 for maintenance purposes. Inasmuch as cylindrical wall 41 is preferably of relatively thin cross-section, it is desirable to employ a backing plate 75 and 76, respectively, secured interiorly of cylindrical wall 41 in the vicinity of clamp sets 51 and 52, as depicted in FIG. 2 and FIG. 4, for added structural support. As such, cap screws 74 will threadably engage cylindrical wall 41 and/or backing plates 75 and 76 for appropriate fastening of clamp sets 51 and 52, respectively.

It should be appreciated that the foregoing structural arrangement is ideally suited for receiving and retaining a plurality of individual flexible cell strips 50 and corresponding interconnect mesh 36 onto support drum 25. Indeed, one end of cell strip 50 and/or interconnect mesh 36 is secured by clamp set 51 and then support drum 25 is rotated to permit the other end of cell strip 50 and/or interconnect mesh 36 to be secured by corresponding clamp set 52.

To control the rotative force needed to rotate support drum 25, and to selectively secure support drum 25 in a fixed orientation, a friction brake assembly 80 is associated with hand wheel 44. This assembly, as depicted in FIG. 1 and FIG. 2, employs a pair of opposing brake pads 81 and 82 hingedly associated with each other by bolt 83. Each brake pad 81 and 82 preferably carries a non-metallic pad, such as a rubber composition, which permits non-destructive frictional contact of brake pads 81 and 82 with hand wheel 44. Adjustable knob 84 controls the clamping force exerted by brake assembly 80 on hand wheel 44 by simultaneously moving the brake pads 81 and 82 relative thereto. A mounting bracket 85 is secured to side plate 13, such as by mounting bolts 86, and fixes brake pads 81 and 82 relative to frame 11. It should thus be appreciated that by varying the clamping force of brake pads 81 and 82 on hand wheel 44, viz., by manipulating adjustable knob 84, the braking force on support drum 25 by brake assembly 80 can be varied from zero, permitting free wheeling of support drum 25, to full brake, locking support drum 25 in a fixed orientation. Likewise it should be recognized that other brake assemblies may be employed in lieu of friction brake assembly 80. Indeed, should a motor and drive train be employed in place of hand wheel 44, a brake assembly may well be associated integrally with the drive train.

It should be recognized that the interconnect drum 10, herein taught, provides substantial advantages in the fabrication of photovoltaic modules. Indeed, by employing support drum 25, the necessary area needed to position and interconnect a plurality of cell strips 50 is substantially reduced. This is so because the strips 50 are wrapped around support drum 25 as opposed to being laid flat on a planar work surface. In addition, because support drum 25 is rotatable, the specific areas of the cell strips 50 at which the interconnect operation is being conducted can be selectively positioned before the operator. This undoubtedly alleviates tension and fatigue of the operator by permitting the specific work area to be positioned before the operator in the most comfortable orientation.

In addition to the foregoing, the instant interconnect drum 10 also permits accurate placement of interconnect mesh 36 relative to the individual cell strips 50. Indeed, by disposing interconnect mesh 36, and accordingly cell strips 50, about a curved surface, such as cylindrical support drum 25, interconnect mesh 36 makes uniform contact with cell strips 50 throughout the entire interconnect region. That is, interconnect mesh 36 does not experience wrinkles or other deformations upon being disposed about a curved surface as it normally experiences when disposed along a planar surface. As such, while support drum 25 is disclosed herein as being substantially cylindrical, it may well define other curved configurations, such as elliptical or parabolic, or sections thereof. Indeed, essentially any suitable arcuate surface will provide the foregoing beneficial attributes. Such is particularly true when interconnect mesh 36 is defined by a delicate fabric as will be appreciated herebelow.

The foregoing advantages of the disclosed interconnect drum 10 may be better appreciated upon consideration of the same in the fabrication of a photovoltaic module. Specifically, a photovoltaic module made in accordance with the teachings of the U.S. patent application entitled "Photovoltaic Cell Module", filed contemporaneously herewith, as discussed above, fabricated on the disclosed interconnect drum 10 will be considered herebelow. In particular, the photovoltaic module contemplated incorporates a plurality of cell strips 50, of perhaps three to twenty in number, each measuring approximately 5 centimeters wide by 120 centimeters long. These cell strips 50 are interconnected by continuous electrically conductive filaments 90 (FIG. 5) alternately and repetitively connected between adjacent cell strips 50.

Interconnect drum 10 is readied for use by positioning support drum 25 in frame 11. This is accomplished by removing arm rest 30 and cover 15 from frame 11, and thereafter positioning shaft 24 of support drum 25 through receiving slots 22 onto bearings 23. Arm rest 30 and cover 15 are thereafter re-secured to frame 11. Hand wheel 44 is positioned between brake pads 81 and 82 of friction brake 80 and knob 84 is adjusted to impart a frictional force on hand wheel 44 sufficient to prevent free wheeling of support drum 25 but, yet, allowing the same to be rotated with moderate force on hand wheel 44 by the operator.

A plurality of cell strips 50 are secured to support drum 25 by clamp sets 51 and 52. Specifically, with reference to FIG. 3, cell clamp 60 and mesh clamp 61, of clamp set 51, are simultaneously opened to receive one end of cell strip 50, which, in turn, is positioned laterally against strip guide dowels 45A. Cell clamp 60 and mesh clamp 61 are then closed onto cell strip 50. Support drum 25 is rotated, clockwise as referenced from FIG. 2, thereby drawing cell strip 50 thereabout. It should be appreciated that arm rest 30 and rolled lip 20 provide support to cell strip 50 to facilitate guidance of the same onto support drum 25. It should further be appreciated that cell strip 50 should be continually guided along strip guide dowels 45A to assure proper positioning of the former on support drum 25. The other end of cell strip 50 is received in and secured by clamp set 52 in the same manner as discussed above relative to clamp set 51. Upon positioning and securement of a full compliment of cell strips 50, which for the exemplary interconnect drum 10 taught herein is a total of twelve strips, the assembly operation can then proceed to alignment and securement of interconnect mesh 36 relative to cell strips 50.

A spool 35 of interconnect mesh 36 is positioned on spool bar 34 relative to the particular cell strip 50 to which interconnect mesh 36 will be secured, as depicted in FIG. 1. Slidable collars 40 permit spool 35 to be selectively positioned transversely along spool bar 34 and retain the same rotatively at a desired location.

Figure 5:
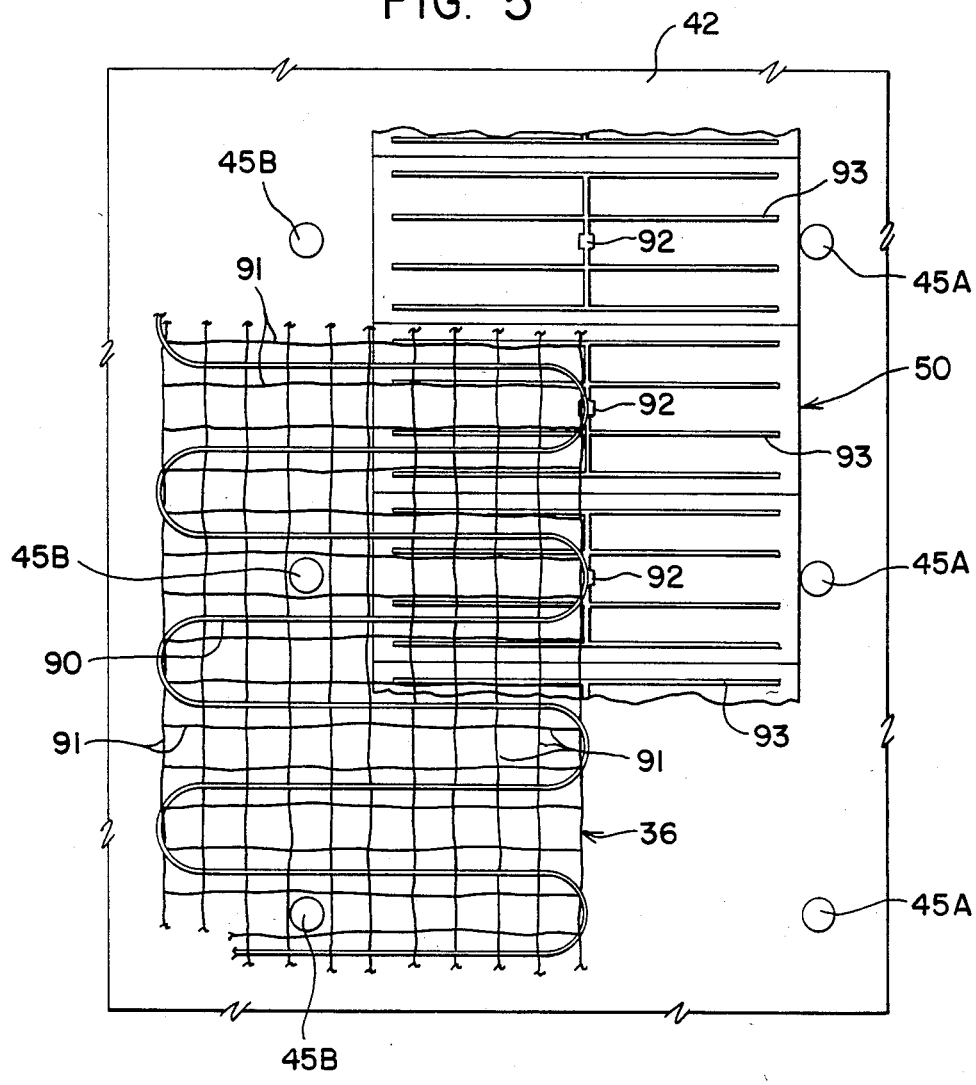
FIG. 5 is an enlarged fragmentary plan view of the apparatus of FIG. 1 and depicting a photovoltaic cell strip and wire interconnect mesh relative thereto.

Interconnect mesh 36, itself, may be better considered by reference to FIG. 5. Particularly, interconnect mesh 36 consists of an open weave polymer, or otherwise electrically non-conductive fabric 91. A fine wire, electrically conductive, filament 90, such as copper wire, is woven into, or otherwise carried by, fabric 91 in a preselected configuration. For the exemplary photovoltaic module discussed hereabove, the preselected configuration is depicted as a continuous repetitive pattern extending substantially throughout the entire fabric 91. The preselected configuration of filament 90 may, of course, vary according to the specific application; it being understood that any configuration of filament 90, including a plurality of discrete segments, is contemplated in this disclosure. It should be appreciated that fabric 91 should preferably be constructed so as to ensure that filament 90 can make suitable contact with the electrically conductive layer of the corresponding cell strip 50 without interference from fabric 91.

With spool 35 positioned over a specific cell strip 50, as depicted in FIG. 1, interconnect mesh 36 may be applied to support drum 25. Particularly, the leading edge of interconnect mesh 36 is positioned and received within mesh clamp 61 of clamp set 52. Note that while mesh clamp 61 and cell clamp 60 were simultaneously opened to receive cell strip 50, only mesh clamp 61 is opened to receive interconnect mesh 36. Cell clamp 60 maintains securement of cell strip 50 continuously throughout the positioning of interconnect mesh 36.

After interconnect mesh 36 has been secured in mesh clamp 61 of clamp set 52, support drum 25 is rotated, counter-clockwise as referenced from FIG. 2, and interconnect mesh 36 is drawn from spool 35 and positioned relative to cell strip 50. When a length of interconnect mesh 36, equal to the length of cell strip 50, has been drawn from spool 35, it is severed therefrom and the end of the segment positioned on support drum 25 is secured in mesh clamp 61 of clamp set 51 in the same manner as discussed hereabove with respect to clamp set 52.

The positioning and securement of interconnect web 36 relative to cell strip 50 is more clearly depicted in FIG. 5. With cell strip 50 properly registered against strip guide dowels 45A, as discussed hereabove, interconnect mesh 36 is partially layered thereover. Mesh guide dowels 45B are properly sized to be received within the interstices of fabric 91 so as to register interconnect mesh 36 relative to cell strip 50.

In the exemplary photovoltaic module, interconnect mesh 36 overlaps cell strip 50 approximately one-half the width of the latter as depicted in FIG. 5. This allows filament 90 to be properly positioned for securement to cell strip 50 at appropriate contact point 92 which may be, for instance, at the mid-point of conductive grids 93 disposed on cell strips 50.

With interconnect mesh 36, and accordingly filament 90, properly positioned relative to cell strip 50, electrical interconnection is effected by applying a conductive epoxy at contact points 92. While conductive epoxy is preferred, other electrical connections may be employed, such as a soldered junction, provided they do not detrimentally affect filament 90 and/or cell strip 50. Such contact points 92 can be effected manually by an operator of interconnect drum 10, or through an automated epoxy deposition system, as would be appreciated by one skilled in the art.

Should a conductive epoxy be employed to define contact points 92, it will thereafter be necessary to allow the epoxy to cure, preferably in an elevated temperature environment. Therefore, when all the cell strips 50 on the support drum 25 have been interconnected with mesh 36, support drum 25 can then be removed from frame 11, with cell strips 50 and interconnect mesh 36 secured thereto. This is accomplished by releasing friction brake 80 and removing arm rest 30 and cover 15 and then withdrawing support drum 25 from receiving slots 22. This assembly can then be placed in a suitable oven for the requisite curing process. Hence, the desirable high temperature performance characteristics of the material from which support drum 25 is constructed are now appreciated. While this support drum 25 is in the curing oven, another support drum 25 can be installed in frame 11 and the fabrication process can continue virtually uninterrupted.

Upon completion of the curing operation, cell strips 50 with interconnect mesh 36 properly secured thereto are removed from support drum 25. Fabrication of the photovoltaic module continues with the step of electrically interconnecting together successive cell strips 50 by selectively connecting filament 90 of one cell strip 50/interconnect mesh 36 combination to a next successive cell strip 50, as would be known by one skilled in the art, thereby effecting the desired series and/or parallel interconnections for the photovoltaic module.

It should therefore be appreciated that the foregoing describes an apparatus for effecting electrical interconnections of flexible cell strips of a photovoltaic module. It should further be appreciated that the foregoing discloses a simple and compact apparatus which permits fine wire filament to be interconnected with such cell strips with minimal operational steps and with ease of handling. Indeed, the disclosed apparatus enables the fine wire filament interconnect to be accurately positioned relative to the cell strips for electrical interconnection therewith. Therefore, the foregoing invention should be recognized as constituting a new, novel and advantageous contribution to the art of equipment for fabricating photovoltaic modules.

We claim:

1. A method for making a photovoltaic module having a plurality of elongated cell strips and electrically conductive interconnects, comprising the steps of:
   positioning a plurality of cell strips along a curved surface such that each cell strip is positioned arcuately therealong;
   securing the cell strips to said curved surface;
   positioning electrically conductive interconnects relative to the cell strips; and,
   selectively electrically communicating and mechanically securing the interconnects to the corresponding cell strip.

2. A method according to claim 1, comprising the additional step of locating the cell strips laterally to each other along said curved surface.

3. A method according to claim 1, wherein said securing the cell strips is effected by at least one pair of complementary clamp sets.

4. A method according to claim 1, wherein said positioning electrically conductive interconnects includes securing the electrically conductive interconnects to an electrically non-conductive mesh in a preselected configuration and positioning said mesh, with the interconnects so secured, relative to the cell strips.

5. A method according to claim 4, wherein the electrically conductive interconnects are interwoven with said electrically non-conductive mesh.

6. A method according to claim 1, wherein said selectively securing is effected with electrically conductive epoxy.

7. A method according to claim 6, comprising the additional step of exposing the cell strips, while secured to said curved surface, to an elevated temperature environment to effect curing of said electrically conductive epoxy.

8. A method according to claim 1, comprising the additional steps of removing the cell strips from said curved surface and electrically communicating the interconnects secured to one cell strip with another cell strip.

* * * * *